(12) United States Patent
Lenhard

(10) Patent No.: US 6,388,549 B1
(45) Date of Patent: May 14, 2002

(54) MAGNET CORE

(75) Inventor: Friedrich Lenhard, Hanau (DE)

(73) Assignee: Vacuumschmelze GmbH, Hanau (DE)

(*) Notice: Subject to any disclaimer, the term of this patent is extended or adjusted under 35 U.S.C. 154(b) by 0 days.

(21) Appl. No.: 09/423,862

(22) PCT Filed: May 13, 1998

(86) PCT No.: PCT/DE98/01327

§ 371 Date: Nov. 15, 1999

§ 102(e) Date: Nov. 15, 1999

(87) PCT Pub. No.: WO98/52052

PCT Pub. Date: Nov. 19, 1998

(30) Foreign Application Priority Data

May 13, 1997 (DE) .......................................... 197 20 010

(51) Int. Cl.$^7$ ................................................ H01F 5/00
(52) U.S. Cl. ........................ 336/200; 336/232; 336/223; 336/213
(58) Field of Search ................................. 336/198, 212, 336/200, 210, 83, 232, 223, 213; 324/127

(56) References Cited

U.S. PATENT DOCUMENTS

| | | | | |
|---|---|---|---|---|
| 5,860,207 A | * | 1/1999 | Knight et al. | 29/605 |
| 5,892,420 A | * | 4/1999 | Larranaga et al. | 335/18 |
| 6,100,783 A | * | 8/2000 | Hopkinson et al. | 336/216 |
| 6,178,617 B1 | * | 1/2001 | Larranaga et al. | 29/602.1 |
| 6,256,865 B1 | * | 7/2001 | Larranaga et al. | 29/605 |

* cited by examiner

*Primary Examiner*—Anh Mai
(74) *Attorney, Agent, or Firm*—Schiff Hardin & Waite

(57) ABSTRACT

A magnet core for current sensors composed of a soft-magnetic alloy is disclosed which comprises at least two bent or buckled alloy band sections.

A magnet core is also described with a primary leg and a secondary leg, whereby the secondary leg is formed of an alloy band section in single lay and of an alloy band section in double lay.

The invention is also directed to a current sensor and to a method for manufacturing a magnet core.

9 Claims, 5 Drawing Sheets

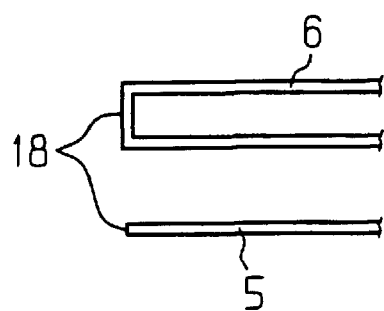
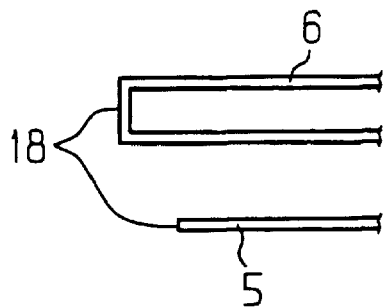
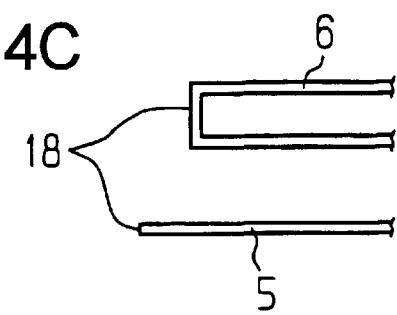
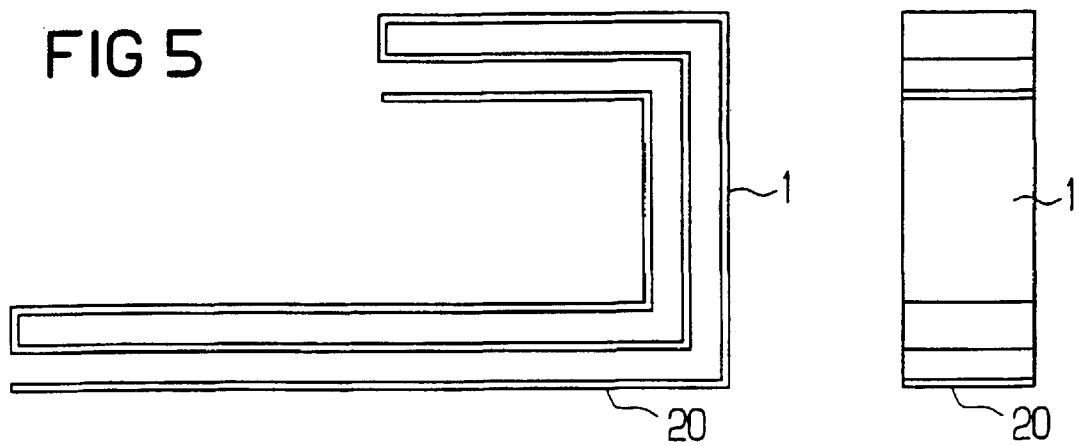

FIG 6
FIG 6A
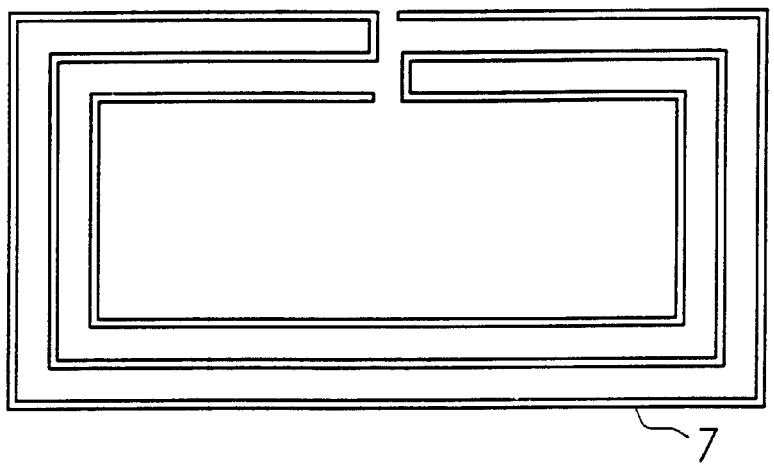
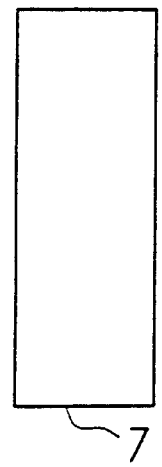
FIG 7
FIG 7A
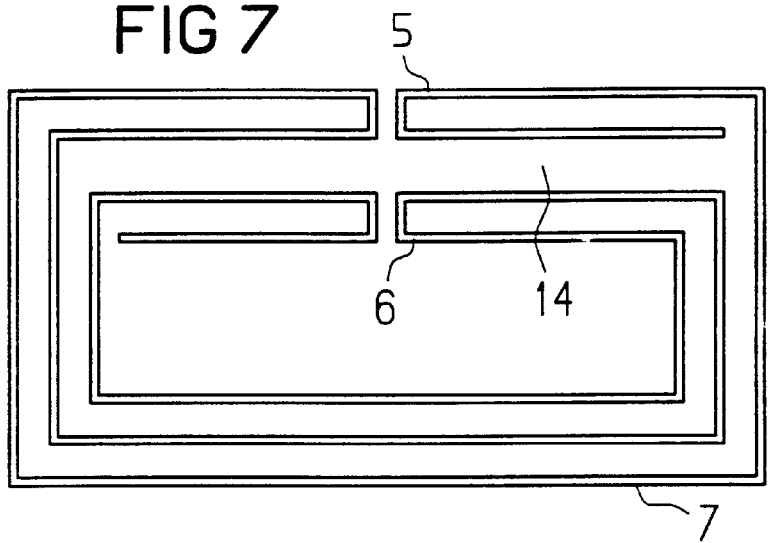
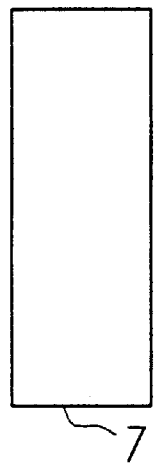

MAGNET CORE

BACKGROUND OF THE INVENTION

The invention is directed to a magnet core for current sensors composed of a soft-magnetic alloy, and is also directed to a current sensor containing this magnet core.

Magnet cores for compensation current sensors composed of soft-magnetic alloys have been known for a longer time. What is characteristic of these cores is that a magnetic field sensor, for example, a Hall element, is arranged in the interior of the secondary leg of the core or in an air gap. In general, the secondary leg encompassing the sensor is inserted into a compensation coil. In known embodiments of compensation current sensors, the magnet cores are executed either as slotted toroidal cores or as sheets stacked in alternation.

The application of a winding for the compensation coil onto the secondary leg is very involved in the case of toroidal cores composed of slotted sheets.

The magnet cores of the second type are of sheets stacked in alternation and can, in fact, be produced without involved winding by plugging the core into a prefabricated coil; however, this procedure requires the punching of the core plates from a band or from sheet metal. During the punching, a high percentage of the core material usually remains as waste. This lost must be either compensated by a higher outlay for material or it is necessary to return the lost material to the initial material on the basis of a recycling step. Corresponding measures, however, are meaningful only to a limited extent due to economic considerations.

The ultimately stacked core sheets of the second type are, as known, produced from rectangularly shaped sheets that comprise a slot in the region of the secondary leg for the acceptance of the magnetic field sensor. The disadvantages recited in the preceding paragraph arising from manufactured due to punching likewise apply to the core plates cited here.

SUMMARY OF THE INVENTION

An object of the present invention is to create a magnet core of the latter type that can be economically manufactured and that does not exhibit the disadvantages of the known magnet cores for current sensors.

This object is inventively achieved by a magnet core for current sensors composed of a soft-magnetic alloy composed of at least two bent or buckled alloy tape sections.

The inventive magnet core is preferably composed of two bent alloy band sections.

The invention is also directed to a current sensor that is characterized in that it contains a magnet core according to the invention.

The invention is also directed to a method for manufacturing the composite magnet core of the invention, comprising the steps:

a) manufacturing an alloy band of a soft-magnetic material, bending or buckling the alloy band in such a way that at least two alloy band sections arise that comprise an angle of 90° or 180° relative to one another, separating or cutting the band to the desired length, whereby the separation or cutting can ensue before or after the bending or buckling, and preferably b) joining of at least two bands produced according to Step a) to form a magnet core.

It is a particular advantage of the present invention that, by replacing the traditional core plates with the inventively shaped band sections, the punching can be eliminated. As a result thereof, the waste arising of necessity during punching is avoided in a simple way. Advantageously, the soft-magnetic material that is utilized can be fully exploited without loss of material.

Dependent on the application for which the inventive core is to be utilized, a person skilled in the art—in conformity with the method of the invention—can set the cross-section of the core to the demands prescribed by the application in an especially simple way. The desired cross-section can be achieved by suitable, multiple buckling or bending of the band.

The invention is explained in greater detail below with reference to the drawings.

BRIEF DESCRIPTION OF THE DRAWINGS

FIG. 4A is an enlarged view of the portion IV of FIG. 2;

FIGS. 4B and 4C are modifications of the view of FIG. 4A;

FIG. 5 is a side view of a further embodiment of a core half;

FIG. 5A shows a slanting secondary leg for space optimization, as can be employed in the embodiments according to FIGS. 1 through 3;

FIG. 5B is an end view of the core half of FIG. 5;

FIG. 6 is a side view of a replacement for a stacked core for a current sensor with Hall generator in undivided structure;

FIG. 6A is an end view of the core of FIG. 6;

FIG. 7 is a side view of a replacement for a stacked core for a current sensor with metallic magnetic field detector or magneto-resistive sensor in undivided structure;

FIG. 7A is an end view of the stacked core of FIG. 7;

DESCRIPTION OF THE PREFERRED EMBODIMENTS

The alloy band is preferably bent or buckled such that the bent or buckled alloy band sections comprise an angle of 90° or 180° relative to one another. Examples of correspondingly bent cores are shown in FIGS. 1, 2, 3, 5, 6, 7, 9 and 10.

When the inventive cores are utilized for compensation current sensors, then these generally comprise a primary and a secondary leg, which is preferably formed of at least two band sections 5 and 6 in the region of the secondary leg.

The band sections 5 and 6 can be shaped such that these form an interspace, a pocket or, respectively, a cavity 14 in the region of the secondary leg. This interspace serves, for example, for the acceptance of a magnetic field sensor.

Figure 1:
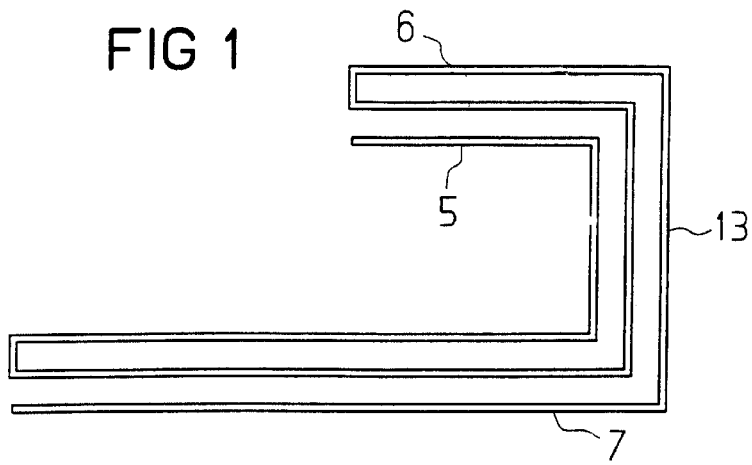
FIG. 1 is a side view of a core half for a current sensor with Hall sensor (not shown). In this embodiment, the Hall sensor is located in an air gap between two symmetrical core halves.
Figure 1A:
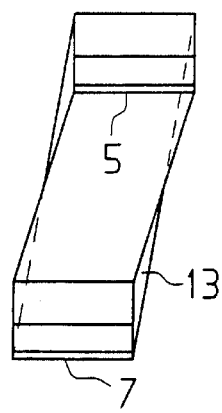
FIG. 1A is an end view of the core half of FIG. 1.
Figure 2:
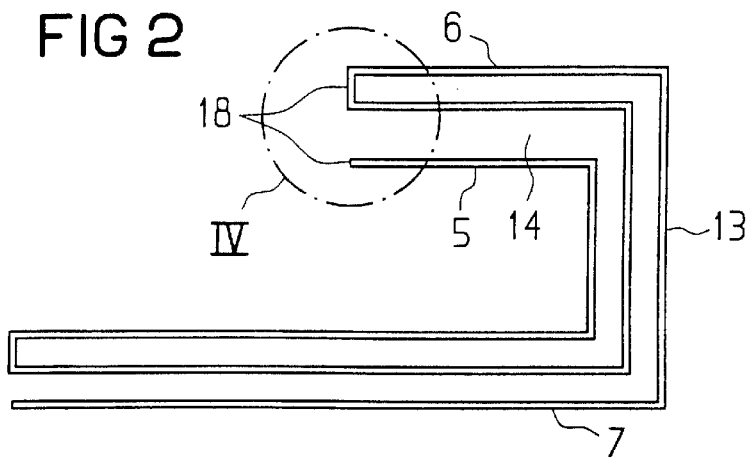
FIG. 2 is a side view of a core half for a current sensor with pocket or, respectively, cavity for the acceptance of a magnetic field sensor with a metallic magnetic field detector or magneto-resistive sensor.
Figure 2A:
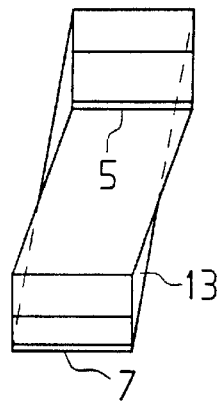
FIG. 2A is an end view of the core half of FIG. 2.
Figure 3:
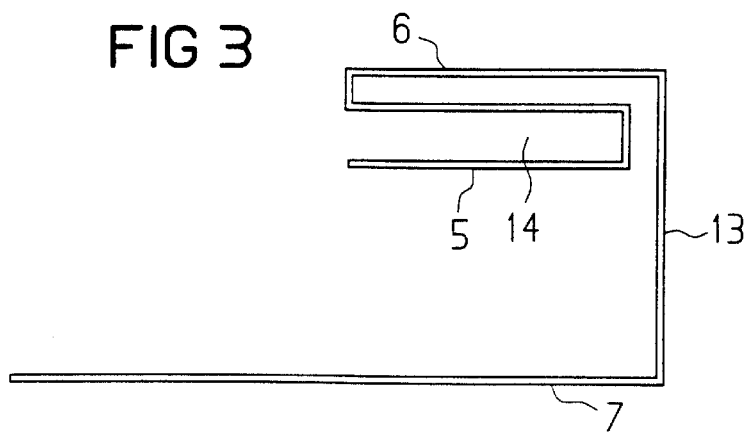
FIG. 3 is a side view of a core half for a current sensor with metallic magnetic field detector or magneto-resistive sensor with partially reduced cross-section corresponding to the side view in FIG. 5A.
Figure 3A:
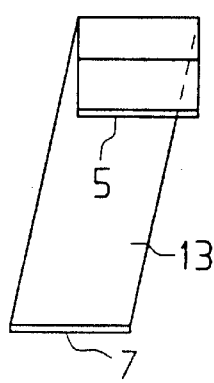
FIG. 3A is an end view of the core half of FIG. 3.

Examples of corresponding embodiments are shown in FIGS. 2, 3, 7, and 10. It is likewise possible to shape the sections 5 and 6 such that no corresponding interspace, as shown, for example, in FIGS. 1, 5 and 6, is present.

The core preferably comprises a primary leg section 7 whose longitudinal axis 15 (see FIG. 10) is oriented parallel to the surfaces of the secondary leg sections 5, 6.

The primary leg in a further, preferred embodiment can be arranged such that the longitudinal axis 15 (see FIG. 10) is oriented parallel to the longitudinal axis 16 of the secondary leg.

In this latter instance, the primary leg section 8 in a further development thereof is then oriented or turned to the lateral surface section 13 relative to the surfaces of the secondary leg. The turning is then preferably implemented such that the surface of the secondary leg section 8 is oriented perpendicular to the lateral core section 13.

The inventive magnet core can be a matter of a core manufactured of a single band section or, preferably, can also be a matter of a core composed of at least two or more parts.

The magnetic core, however, is especially preferably composed of a first part 1 and of a second part 2, whereby the parts 1, 2 are shaped mirror-symmetrically relative to one another.

The alloy band sections that form the magnet core are expediently arranged such that the inwardly directed edges or ends 18 of the secondary leg section or sections 5, 6 of the first part 1 and the inwardly directed edges of the secondary leg part or parts 9, 10 of the second part at least partially abut one another at the secondary side.

At least one leg pair 10, 12 or 5, 9 that forms an air gap 17 (FIG. 8) is preferably located under the meeting leg sections. When the secondary leg is composed of two leg pairs, this means that the secondary leg parts of the first pair abut one another and the secondary legs of the other pair do not, so that these form an air gap. For example, that the leg sections 5, 6 and the leg parts 9, 10 at the secondary side lie at least partially edge-against-edge.

The secondary legs can also be composed of a plurality of band sections 5, 6 that proceed parallel to one another at a specific distance from one another and that usually both project into the magnet coil.

Preferably, the first and the second part 1, 2 is arranged and shaped such that the primary-side leg section 7 of the first part 1 and the primary-side leg section 11 of the second part 2 overlap at least partially planarly at the primary side.

In another preferred embodiment, the first and the second part 1, 2 is conically shaped, so that the primary-side leg section of the first part and the primary-side leg section of the second part form a common rectangular surface 20 formed of two triangles 19 at the primary side. An example of a corresponding arrangement is shown by FIGS. 5, 5A and 5B.

Figure 11:
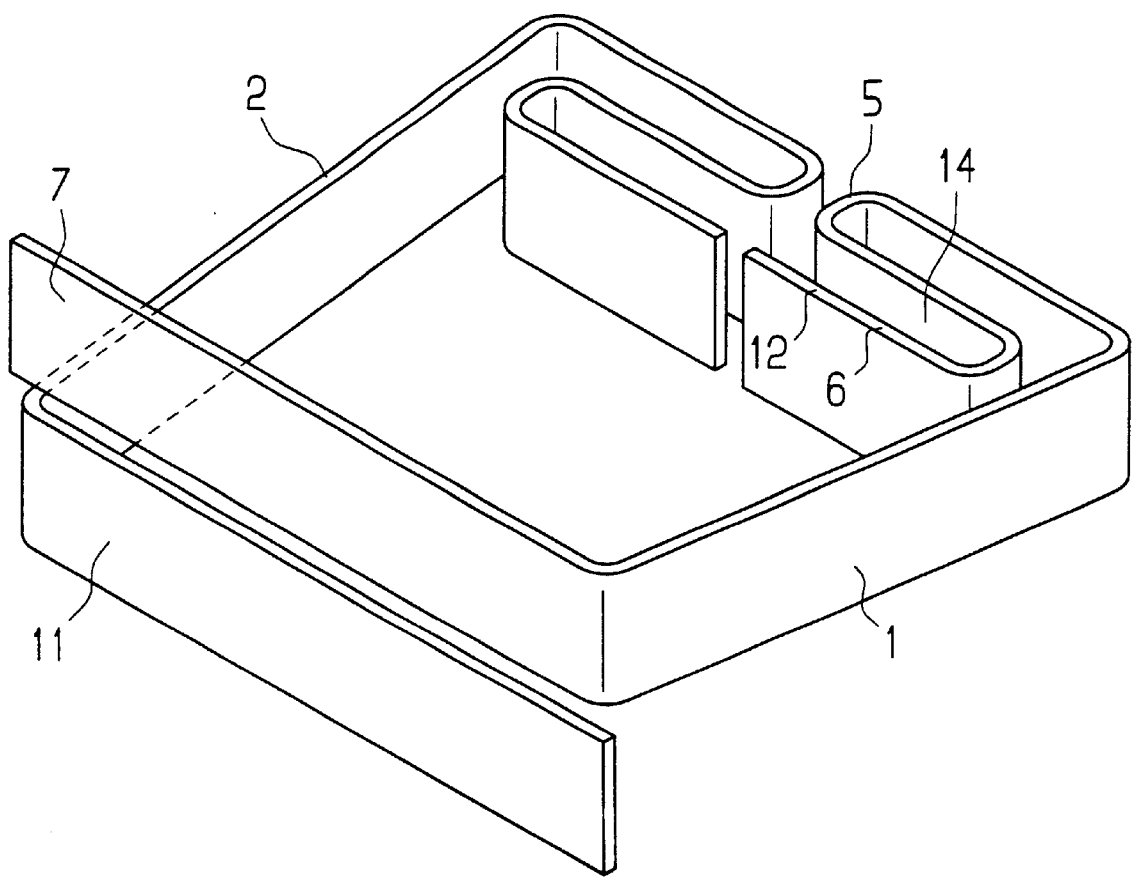
FIG. 11 is a perspective view of a pair of core halves.

As a further preferred embodiment, the first and the second magnet core part 1, 2 are shaped such that the lateral surfaces 13 (see FIGS. 1A, 2A, 3A and 11) proceed obliquely, so that the primary-side leg section 7 of the first part 1 and the primary-side leg section 7 of the second part 2 proceed parallel to one another at the primary side, whereby the surfaces of the primary-side leg sections 7, 11 come to lie on one plane. An example of such an arrangement is shown in a three-dimensional view in FIG. 11.

A further subject matter of the invention is a magnet core having a primary leg and a secondary leg, this being characterized in that the secondary leg is formed of an alloy band section in individual leg 5 and of an alloy band section in double lay 6.

Examples of secondary legs shaped in this way are shown in FIGS. 4A, 4B and 4C. The Figures represent an excerpted magnification of the circular region in FIGS. 2. The illustrated secondary leg shapes can also be employed analogous in the embodiments in FIGS. 1, 2, 3 and 5.

The alloy band section in single lay and the alloy band section in double lay preferably form a pocket or a cavity 14 having a volume of at least 1 mm$^3$, preferably 4 mm$^3$, that is suitable for the acceptance of a magnetic field sensor.

Figure 8:
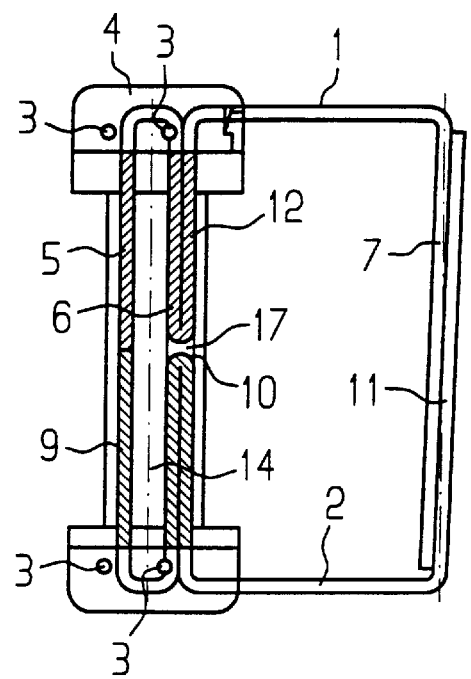
FIG. 8 shows a magnet core for a compensation current sensor having a coil housing at the secondary leg of the magnet core.

The magnet core shown in FIG. 8 is composed of a first core part 1 and of a second core part 2 so that the secondary leg sections 5, 6 of the first alloy band section together with the secondary leg of the second alloy band section lie against one another edge-against-edge. The parts of the secondary leg located at the inside are implemented shortened, so that an air gap 17 forms at the connecting point. Surprisingly, the sensitivity of a compensation current sensor or of a similar component part can be improved when at least one air gap 17 is present in the region of the secondary leg. In FIG. 8, the primary leg section 7 is arranged so that the primary leg of the first alloy band section 7 and the primary leg of the second alloy band section 11 planarly overlap. A planar overlap at the primary leg is also present given the embodiment for a core half shown in FIG. 10. In this embodiment, the sections 8 of the two core halves overlap.

Figure 9:
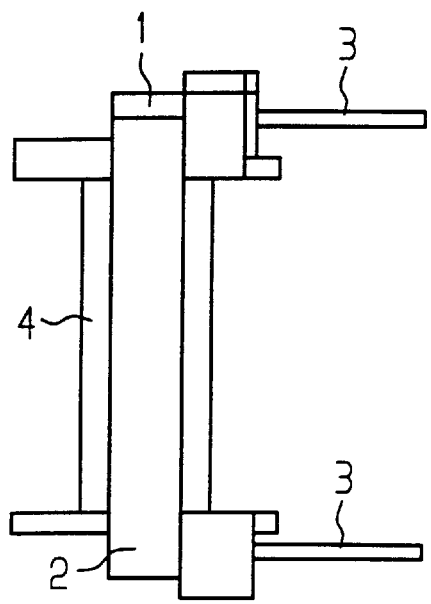
FIG. 9 shows the compensation current sensor of FIG. 8 in a side view.
Figure 9A:
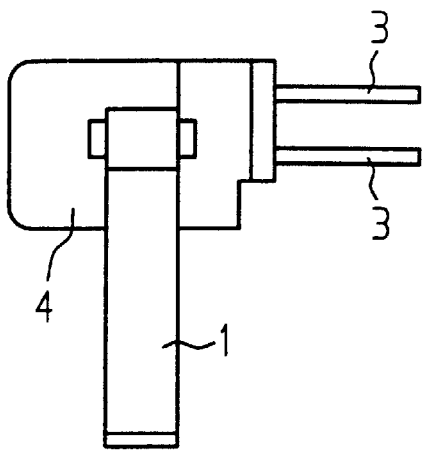
FIG. 9A shows the compensation current sensor of FIG. 8 in an end view.
Figure 10:
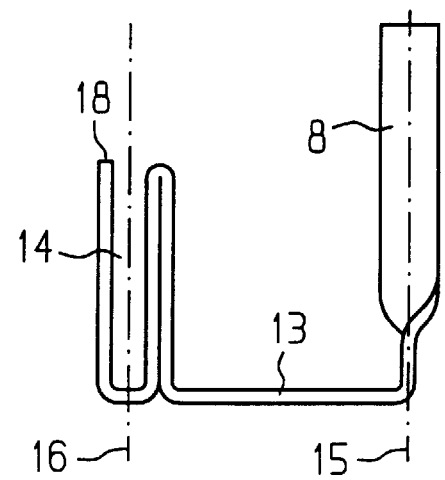
FIG. 10 shows an alloy band section for a magnet core having a primary leg turned by 90° relative to the side section.

A current sensor containing the inventive core is illustrated in FIGS. 8, 9 and 9A. The composite core made of the parts 1 and 2 is encompassed by a compensation coil 4. The contact lead-throughs 3 for the compensation coil 4 and the magnetic field sensor (not shown) are conducted out at the housing floor. The magnetic field sensor is arranged in a pocket 14.

What is claimed is:

1. A magnet core for current sensors composed of soft-metallic alloy composed of alloy band sections, said magnet core being composed of a first part of a magnet core and of a second part of a magnet core, the parts being shaped mirror-symmetrically relative to one another, each part having an intermediate section with a primary leg section extending at 90° from one end and at least two secondary leg sections extending at 90° a second end to form a substantially U-shaped structure with one of the at least two secondary leg sections having a different length than the other secondary leg sections, each part being arranged with end edges of the secondary leg sections of the first and second parts facing each other and at least partially abutting one another at a secondary side so that at least one pair of the secondary leg sections forms an air gap between meeting leg sections and one pair are abutting one another free of an air gap.

2. A magnet core according to claim 1, wherein the secondary leg section is formed of at least two alloy band sections with a pocket therebetween for the acceptance of a magnetic field sensor within the magnet core in the region of the secondary leg sections.

3. A magnet core according to claim 1, wherein the primary leg sections are oriented parallel to the secondary leg section.

4. A magnet core according to claim 1, wherein a longitudinal axis of the primary leg sections of each part extends parallel to the longitudinal axis of the secondary leg section of the part.

5. A magnet core according to claim 4, wherein the intermediate section of each part extends obliquely so that the secondary leg sections and the primary leg sections are offset from each other.

6. A magnet core according to claim 5, wherein the primary leg sections are longer than the secondary leg sections so that the primary leg sections of the two parts extend side-by-side in a single plane.

7. A magnet core according to claim 1, wherein each of said parts is conically shaped so that the leg sections of the one part and the leg sections of the second part form a shared rectangular surface of the two triangles on a primary side.

8. A magnet core according to claim 1, wherein a secondary leg section of each part is formed by an alloy band section of a single lay and an alloy band section of a double lay.

9. A magnet core according to claim 8, wherein the alloy band section of the single lay and the alloy band section of the double lay form a pocket having a volume of at least 1mm$^3$ suitable for acceptance of a magnetic field sensor.

* * * * *